(12) United States Patent
Dinteman

(10) Patent No.: US 6,175,939 B1
(45) Date of Patent: Jan. 16, 2001

(54) INTEGRATED CIRCUIT TESTING DEVICE WITH DUAL PURPOSE ANALOG AND DIGITAL CHANNELS

(75) Inventor: Bryan J. Dinteman, Canby, OR (US)

(73) Assignee: Credence Systems Corporation, Fremont, CA (US)

( * ) Notice: Under 35 U.S.C. 154(b), the term of this patent shall be extended for 0 days.

(21) Appl. No.: 09/280,485

(22) Filed: Mar. 30, 1999

(51) Int. Cl.$^7$ .............................. G06F 11/00; H04B 1/74
(52) U.S. Cl. ..................... 714/724; 714/738; 714/37
(58) Field of Search .................... 714/738, 739, 714/724, 727, 728, 733, 742, 712, 37, 32, 33

(56) References Cited

U.S. PATENT DOCUMENTS

| | | | |
|---|---|---|---|
| 5,696,773 | 12/1997 | Miller | 714/745 |
| 5,951,705 | * 9/1999 | Arkin et al. | 714/738 |
| 5,974,578 | * 10/1999 | Mizokawa et al. | 714/727 |

* cited by examiner

Primary Examiner—Christine T. Tu
(74) Attorney, Agent, or Firm—Daniel J. Bedell; Smith-Hill and Bedell

(57) ABSTRACT

An integrated circuit (IC) tester includes a set of dual-purpose digital/analog channels. Each tester channel includes a driver capable of supplying either a digital or analog test signal input to an IC terminal and a receiver for digitizing and processing either an analog or digital IC output signal appearing at the DUT terminal to produce results data representing the behavior of that IC output signal during a test. A test is organized into a succession of test cycles, and before each test cycle a pattern generator within each channel produces data for controlling the behavior of the driver and receiver during the test cycle. The control data controls whether the driver is to produce an analog or a digital test signal, controls a magnitude or logic level to which the test signal is to be driven during the test cycle, and controls a time during the test cycle of any test signal state or magnitude changes. The control data also indicates how and when the receiver digitizes and processes an IC output signal during the test cycle.

21 Claims, 5 Drawing Sheets

INTEGRATED CIRCUIT TESTING DEVICE WITH DUAL PURPOSE ANALOG AND DIGITAL CHANNELS

BACKGROUND OF THE INVENTION

1. Field of the Invention

The present invention relates in general to integrated circuit (IC) testers and in particular to a tester having both analog and digital testing capability in each of its channels.

2. Description of Related Art

When an integrated circuit (IC) such as an analog-to-digital converter (ADC) or a digital-to-analog converter (DAC) has both analog and digital input/output signals it has to be tested with an integrated circuit tester having both analog and digital channels. For example to test an ADC, the tester must supply an analog input signal to the ADC and monitor the sequence of digital output signals it produces to determine whether the ADC is properly digitizing its analog input signal. Conversely to test a DAC, the tester must supply a sequence of digital data values as input to the DAC and then monitor the DAC's analog output signal to determine whether it exhibits the behavior defined by the input data sequence.

Figure 1:
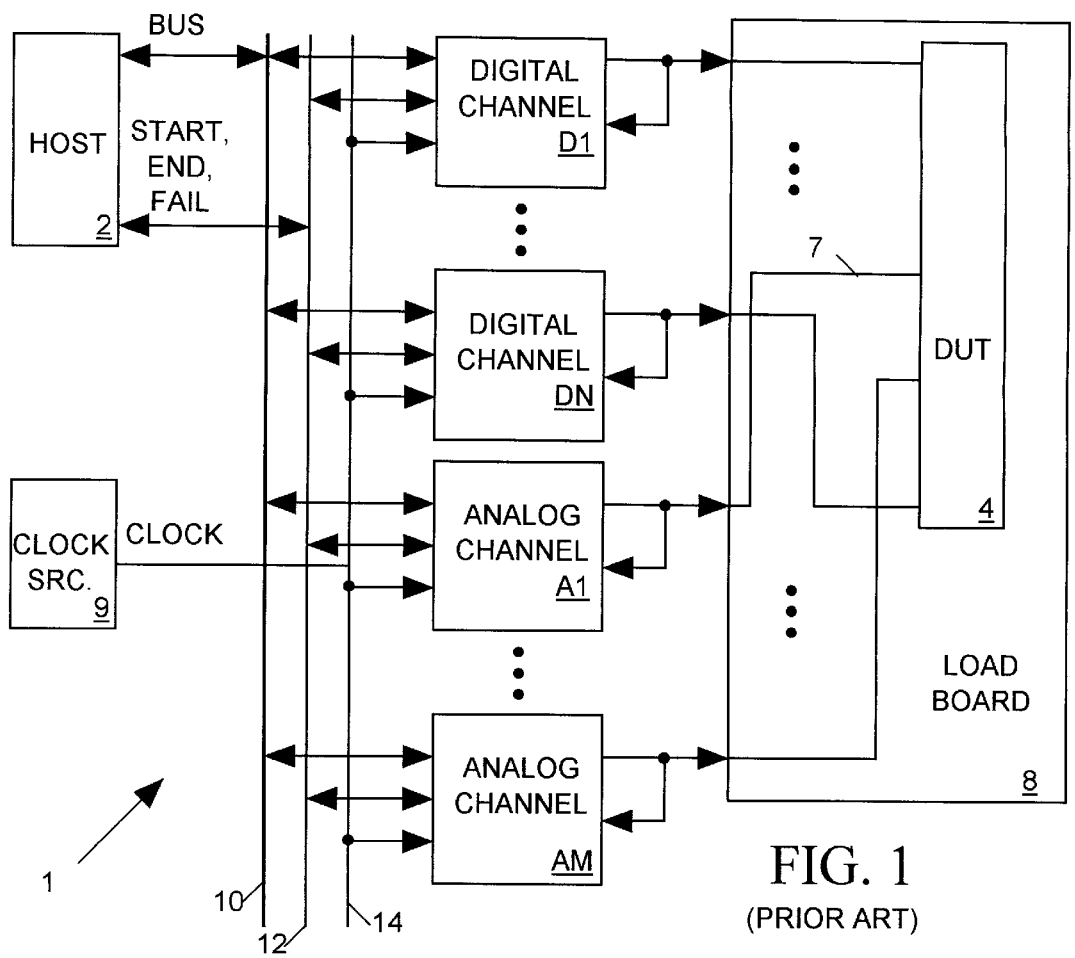

FIG. 1 illustrates a typical general purpose IC tester including a set of N digital channels D1–DN and a set of M analog channels A1–AM for testing an ADC or DAC or other analog/digital device under test (DUT) 4. Each digital channel D1–DN may be connected to a separate digital I/O terminal of DUT 4 and may either supply a digital test signal input to that terminal or sample a digital DUT output signal produced at that terminal to determine its state. Each analog channel A1–AM may be connected to an analog DUT I/O terminal and may either supply an analog test signal input to the terminal or may digitize a DUT output signal at the terminal to produce a waveform data sequence representing the behavior of that DUT output signal. A "load board" 8 holds the DUT 4 during the test and provides traces 7 for routing signals between each DUT 4 I/O terminal and an appropriate digital channel D1–DN or analog channel A1–AM.

A test is organized into a succession of test cycles, and before the start of each test cycle each digital channel D1–DN needs a vector (a data value) to tell it what to do during the test cycle. The vector may, for example, tell the channel how and when to change the state of a test signal it supplies to a DUT 4 terminal during the test cycle, or may tell the channel to sample a digital DUT output signal generated at that terminal to determine whether it is of an expected state. Each analog channel A1–AM also needs data to tell it what to do during a test. For example if an analog channel is to generate an analog test signal, the channel requires a data sequence telling it how the analog test signal is to vary with time during the test. When an analog channel is to digitize an analog DUT output signal, it requires data telling it when to sample the output signal.

Before the start of a test a host computer 2, connected to all digital and analog channels D1–DN and A1–AM via a bus 10, sends the necessary vectors and programming data to each digital and analog channel. Thereafter host computer 2 sends a START signal concurrently to all channels telling them to begin the test. The channels D1–DN and A1–AM then begin performing the test activities defined by their input vectors and control data, synchronizing their activities to a master clock signal (CLOCK) produce by a clock source 9.

Since a test can span millions of test cycles, and since each digital channel D1–DN must store vector data to define its test activities for each test cycle, a vector memory within each digital channel that stores that data must be relatively large. One way to minimize the size of the vector memory is to keep the number of bits in each vector as small as possible while still providing a sufficient number of bits to distinguish between the various kinds of test events and event times that a vector may select. In order to keep a vector small, it has to be efficiently encoded. In a typical tester, vectors are of fixed size and certain fields of a digital channel vector are reserved for indicating the action the channel is to take, while other fields of the vector are reserved for indicating times during a cycle at which the channel is to take the actions. There is an inherent waste in such fixed allocation system for vector fields when the range of test activities and timing carried out by a channel during a test is relatively smaller than the range of activities and times that can be defined by a fixed length vector with reserved fields. It would therefore be beneficial if a tester could dynamically select vector size and assign meaning to each vector value to match the requirements of the test to be performed.

A general purpose tester with both analog and digital channels will typically not be able to use all its channel memory resources during any particular test. For example when testing a purely digital DUT, none of the analog channels are needed, or when testing a purely analog DUT, none of the digital channels are needed. Thus depending on the type of DUT being tested, much of the channel memory and other resources of the tester remain idle. If a tester could more flexibly allocate its resources, particularly its memory resources, it could perform longer and more complicated tests. For example, if a test requires digital channels only, it would be helpful if memory resources of the idle analog channels could in some way be made available to the digital channels so that they could store longer vector or instruction sequences.

It is helpful to position the channels as close as possible to the DUT so that DUT input and output signals do not have far to travel over load board routing paths 7 between the channels and the DUT terminals. Short signal paths help to reduce signal distortion and allow tests to be performed at higher signal frequencies. Since the tester architecture of FIG. 1 includes both the analog and digital channels, and since each channel requires a certain amount of space in the tester, it is difficult to position them as closely to the DUT as in a tester employing only digital channels. Thus load board 8 requires relatively longer signal routing paths 7. For this reason a general purpose tester having both analog and digital channels is unable to perform purely digital tests at as high a frequency as a similar tester having only digital channels. It would therefore be beneficial to provide an architecture for a general purpose analog/digital tester that minimizes the amount of space required by its channels.

Since a general purpose analog/digital tester must be able to test DUTs having a wide variety of analog and digital pin arrangements, it is not possible to know how best to configure the tester's channels. We do not know how to best allocate resources between analog and digital channels and we do not know how to best position analog and digital channels so as to minimize signal path distances. A test channel configuration that may be optimal for one DUT pin arrangement will not be optimal for a DUT having a different pin arrangement. It would therefore be beneficial to provide a tester in which channel configuration is substantially optimized for all DUT pin arrangements.

When it is necessary to perform a sequence of tests on DUT 4, host computer 2 must reprogram the channels after each test of the sequence. Since host computer 2 may have to send a large amount of data to the channels over bus 10 in order to reprogram them, such reprogramming effort between tests often requires substantially more time than the tests themselves. This reprogramming time substantially limits the throughput of a tester. It would be beneficial to provide a tester that can perform a sequence of digital/analog tests without having to be reprogrammed between tests.

What is needed is an integrated circuit tester capable of having both digital and analog signals, that minimizes signal routing distances between the tester and DUT and which makes efficient use of memory resources.

SUMMARY OF THE INVENTION

An integrated circuit (IC) tester in accordance with one aspect of the present invention includes a set of dual purpose digital and analog channels, each for carrying out a sequence of test activities at terminals of an integrated circuit device under test (DUT). The tester organizes a test into a set of successive test cycles, and during each test cycle each channel may supply either an analog or digital test signal input to the DUT terminal or may process a DUT output analog or digital signal at the terminal to produce output data indicating the behavior of the DUT. Since each channel can perform either analog or digital test activities, it isn't necessary to provide separate analog and digital channels. Since a dual purpose digital/analog channel in accordance with the invention is not much larger than a single purpose digital channel, it eliminates the space requirements of separate analog channels. Dual purpose channels can therefore be positioned more closely to the DUT than a set of single purpose analog and digital channels, thereby allowing tests to be carried out at higher frequencies with less distortion.

Since all channels have both analog and digital capability, we do not have to worry about how to best allocate channel resources between analog and digital channels and it becomes easier to determine how to best distribute channels relative to the DUT's input/output pins. We can substantially optimize channel distribution for all DUT pin arrangements regardless of the relative positions of analog and digital DUT pins. The dual-purpose channels also eliminate the need for connecting two separate channels to a DUT pin requiring both analog and digital tests.

In accordance with another aspect of the invention, each tester channel includes a driver, a receiver and a timing signal generator. The driver may supply a digital or analog test signal to a DUT terminal during each test cycle and the receiver may sample and process a DUT output signal appearing at the DUT terminal during each cycle to produce the channel output data representing the behavior of that output signal. The timing signal generator supplies timing signals to the driver and receiver for use as timing references when carrying out their test activities.

In accordance with a further aspect of the invention, each channel also includes a pattern generator. Before the start of a test, a host computer programs the pattern generator to produce an output data value (a "vector") for each test cycle. The vector references the test actions the driver and receiver are to carry out during the test cycle and also references times during the test cycle at which the actions are to be carried out. A lookup table included in each channel decodes the vector to produce control data input to the driver, the receiver and the timing signal generator telling them what to do during the test cycle. The control data tells the driver how to change the state or magnitude of its analog or digital output signal during the test cycle and tells the receiver how to sample and process the DUT signal during the test cycle to produce output data indicating its behavior. The control data input to the timing signal generator tells it when to assert its output timing signals during the test cycle. One timing signal tells the driver when to respond to its input control data during a test cycle while another timing signal tells the receiver when during a test cycle it is to respond to its input control data.

In accordance with another aspect of the invention, the driver of each tester channel includes a digital-to-analog converter (DAC) for generating an output signal having a magnitude determined by a "LEVEL" field of the control data input from the lookup table. A tri-state buffer buffers the DAC output to produce an analog or digital test signal input to the DUT. When the driver output is an analog signal, the LEVEL field of its control data input steps through a range of states over successive test cycles, and the DAC output appears as a step-wise approximation of the desired analog output signal. A filter inserted between the DAC and the tri-state driver filters the DAC output signal to smooth the edges created by the discrete levels of the DAC in order to produce a smoothly changing analog output signal. When the driver output is a digital signal, the filter is removed from between the DAC and the tri-state buffer so that the driver output signal exhibits the discrete state changes characteristic of a digital signal. The control data supplied to the driver not only controls the magnitude of the driver output signal, it also controls whether the filter is inserted between the DAC and the tri-state buffer as well as various characteristics of the filter. Another bit of the control data may also tri-state the buffer when the channel is not to actively drive the DUT terminal. Since the dual purpose driver in accordance with the invention uses much the same components to create both analog and digital test signals, it is not much larger than a single purpose digital driver.

In accordance with another aspect of the invention, each tester channel includes a receiver capable of digitizing and processing either analog or digital DUT output signals in order to produce tester output data indicating the behavior of the DUT in response to its input test signals. The receiver includes a digitizer for digitizing an analog or digital DUT output signal at a time during each test cycle indicated by an input timing signal in order to produce output data representing the DUT output signal magnitude. The control data input to the receiver tells it how to process the digitizer output to produce data representing the behavior of the DUT during the test cycle. For example, when the DUT output signal is a digital signal, the control data input to the receiver may indicate an expected logic level of that digital signal and may tell the receiver to produce output FAIL signal when the digitizer output is not of the expected logic level. Or as another example, when the DUT output signal is an analog signal, the control data may tell the driver to store the digitizer output data for each test cycle in an acquisition memory to provide a waveform data sequence representing the analog DUT output signal that can later be read and analyzed by the host computer. Since the dual purpose receiver in accordance with the invention uses the same set of components to flexibly process both digital and analog signals, it is not much larger than a single purpose digital receiver. The tester architecture employing dual purpose tester channels in accordance with the invention makes more efficient use of resources than prior art testers employing single purpose analog and digital channels. For example in a test involving only digital signals, a prior art tester channel does not use resources allocated to the analog channels.

However in a tester employing dual purpose channels in accordance with the invention all of each channel's resources can be devoted to digital operations and very little of each channel's resources are idle. Conversely when a channel is to act only as an analog channel during a test, substantially all of its resources can be devoted to analog functions. The dual purpose channel architecture of the present invention is particularly flexible in the way it can efficiently allocate its pattern generation resources depending on whether the channel is to act as a driver or receiver and on whether it is to produce or receive analog or digital signals. This efficient use of resources makes the dual purpose tester architecture very compact without impacting its ability to perform a wide range of analog and digital tests.

The concluding portion of this specification particularly points out and distinctly claims the subject matter of the present invention. However those skilled in the art will best understand both the organization and method of operation of the invention, together with further advantages and objects thereof, by reading the remaining portions of the specification in view of the accompanying drawing(s) wherein like reference characters refer to like elements.

BRIEF DESCRIPTION OF THE DRAWING(S)

Figure 2:
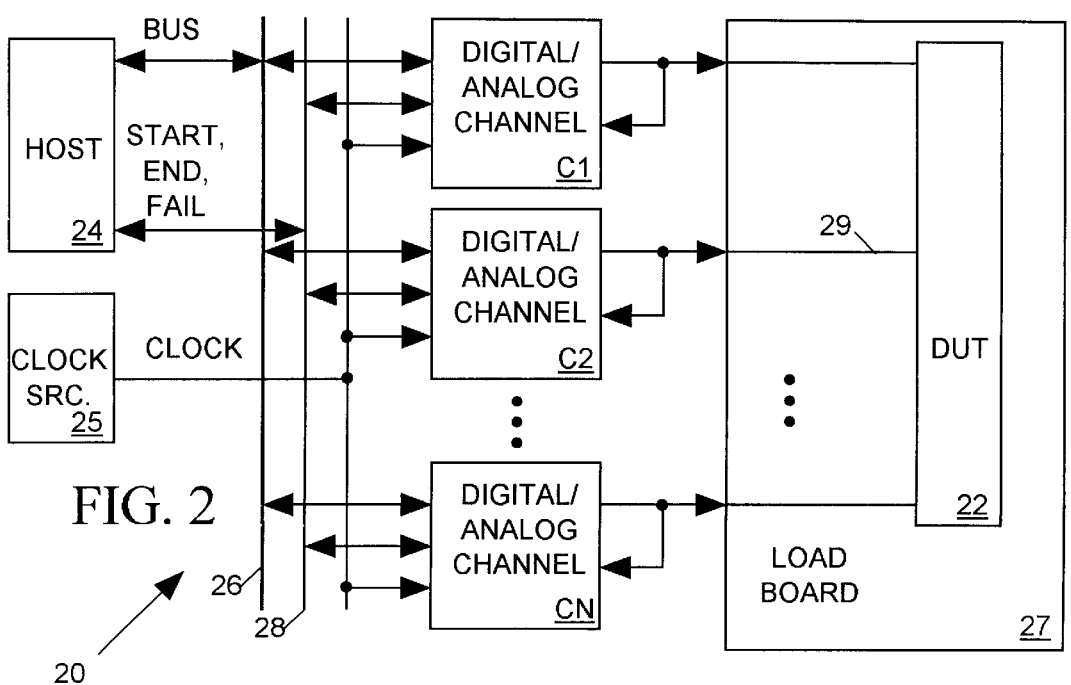
Figure 3:
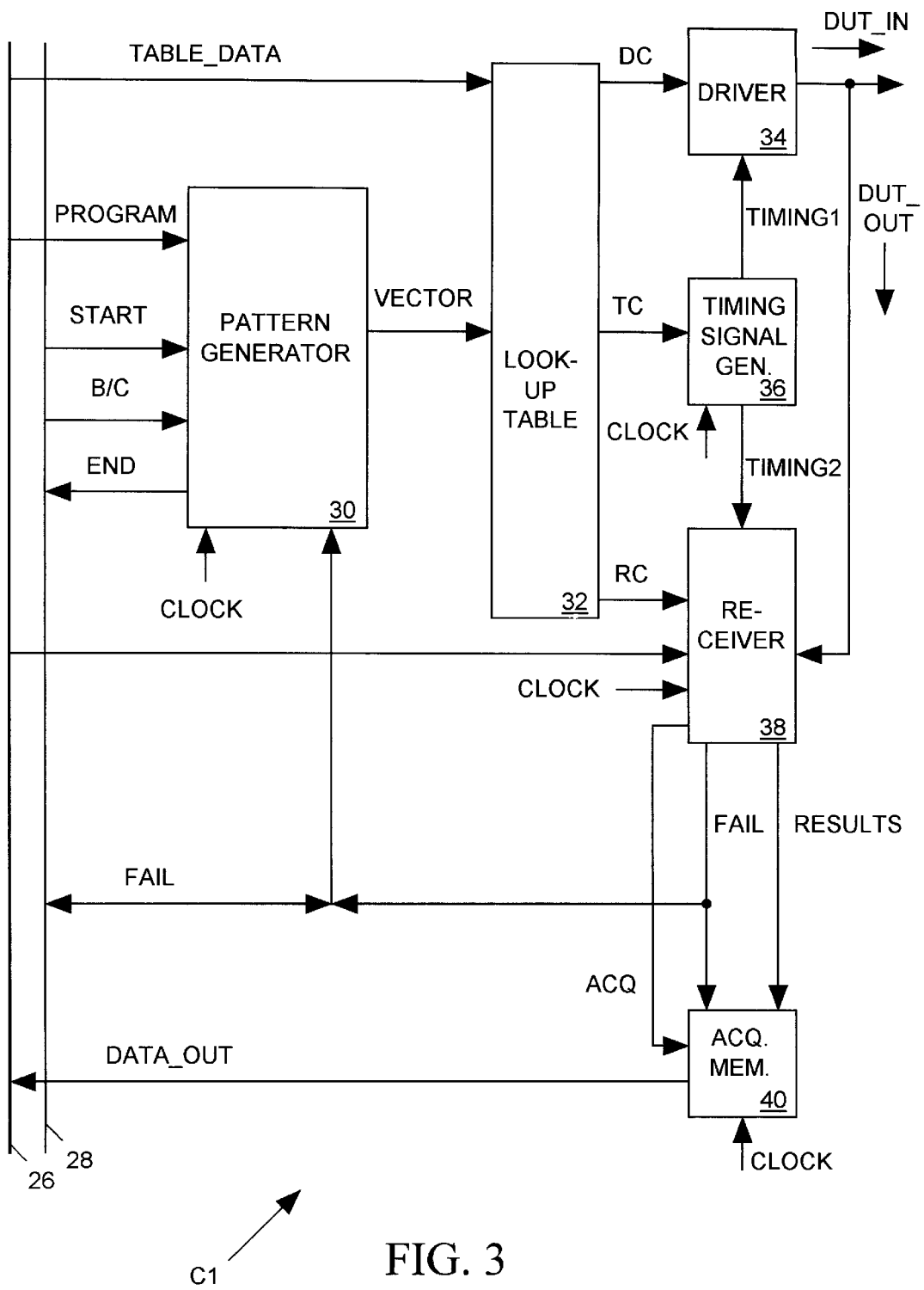
Figure 4:
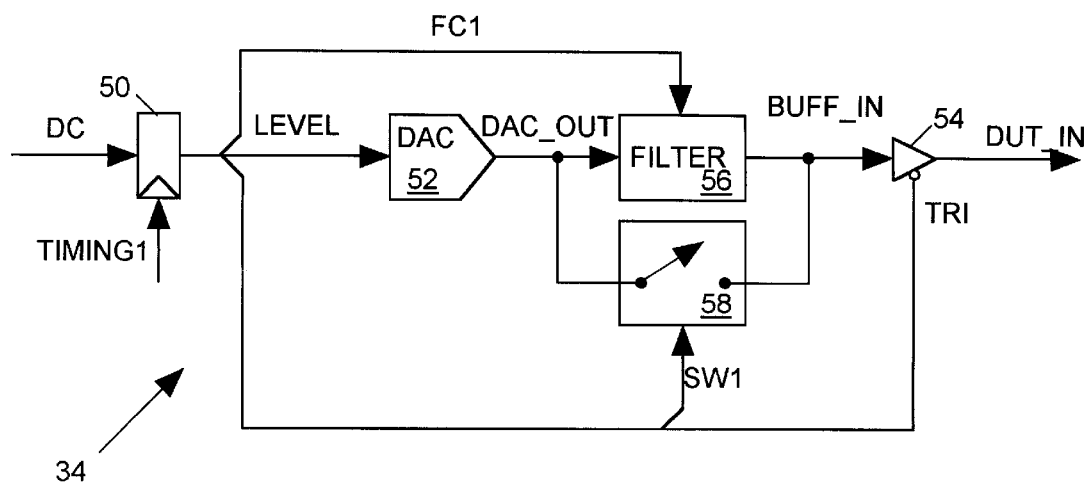
Figure 5:
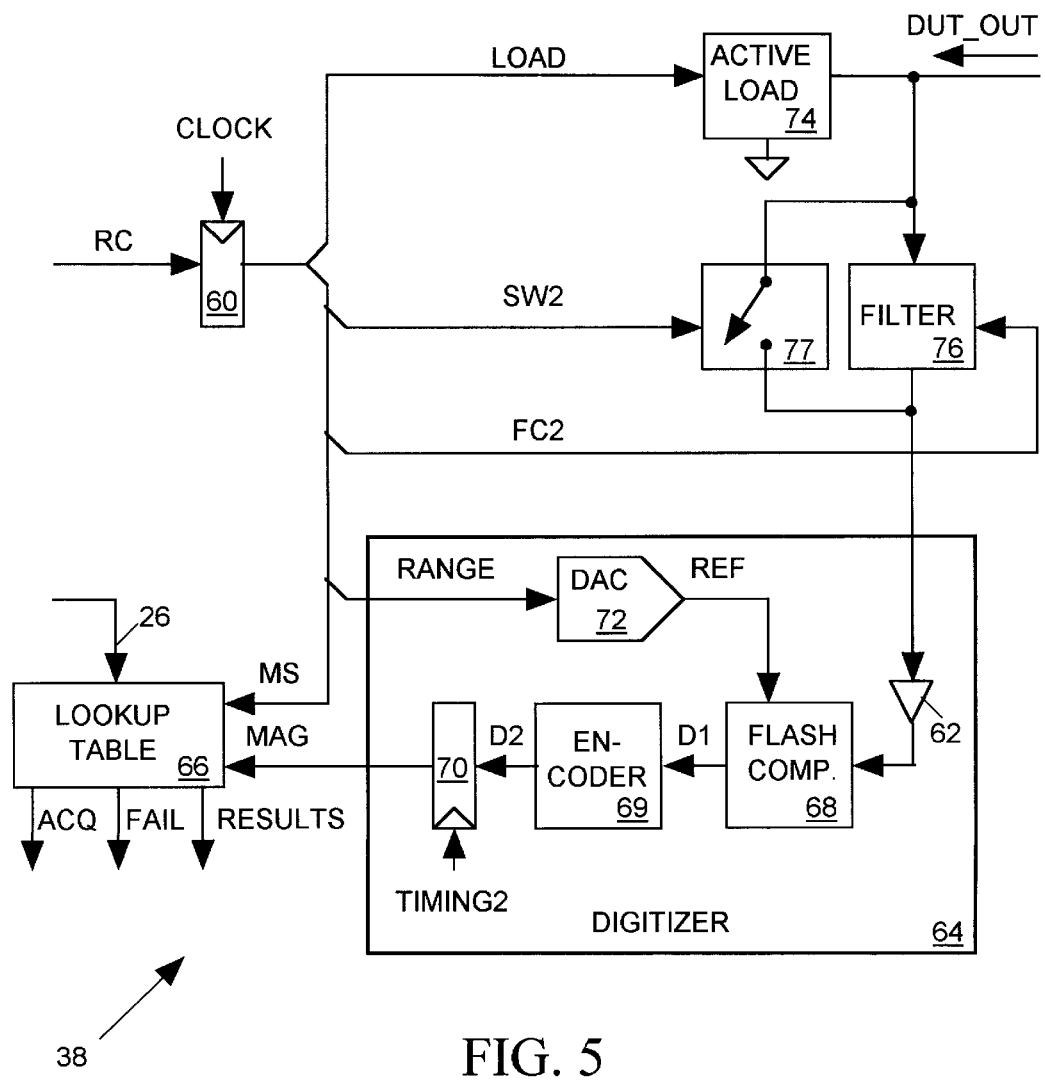
Figure 6:
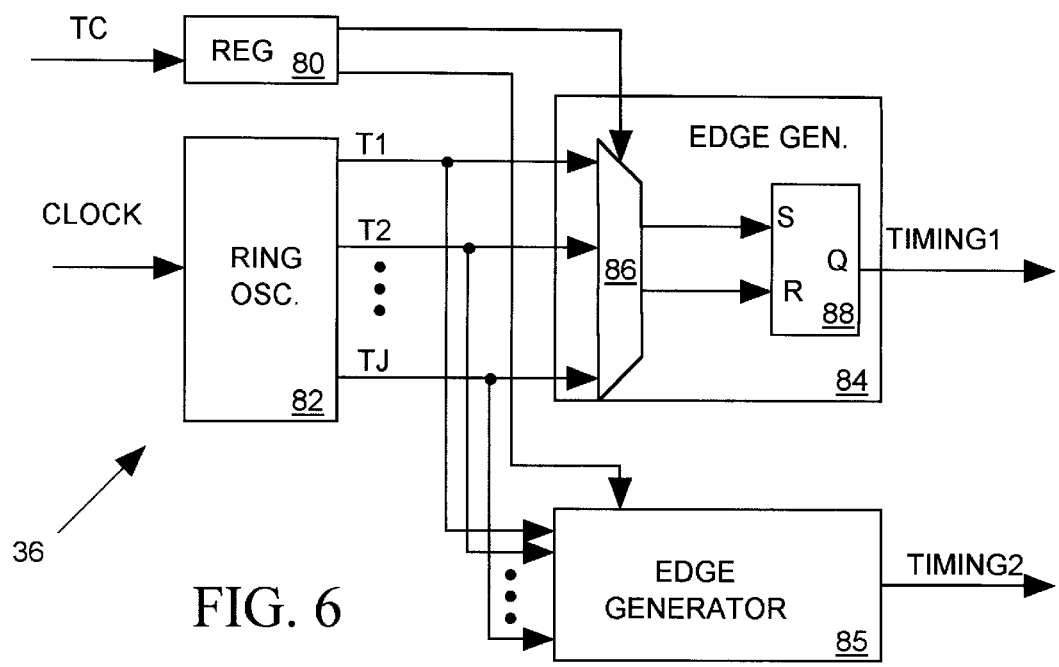
Figure 7:
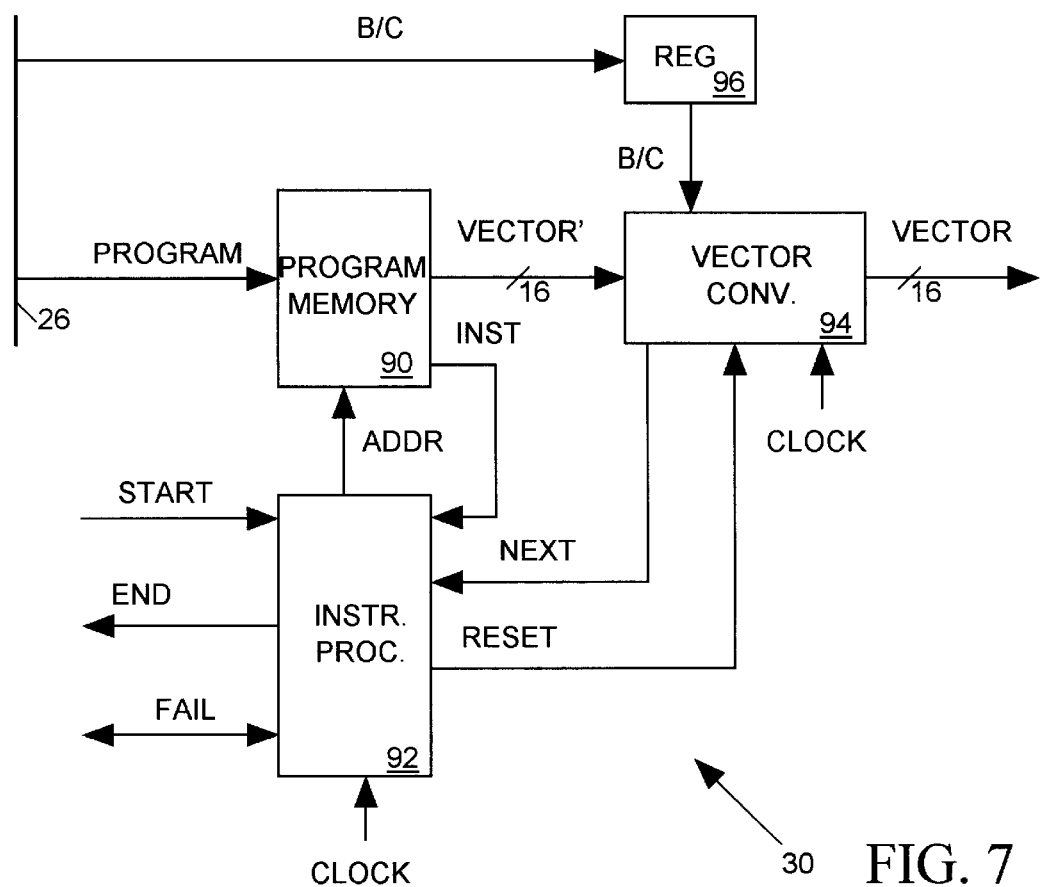
Figure 8:
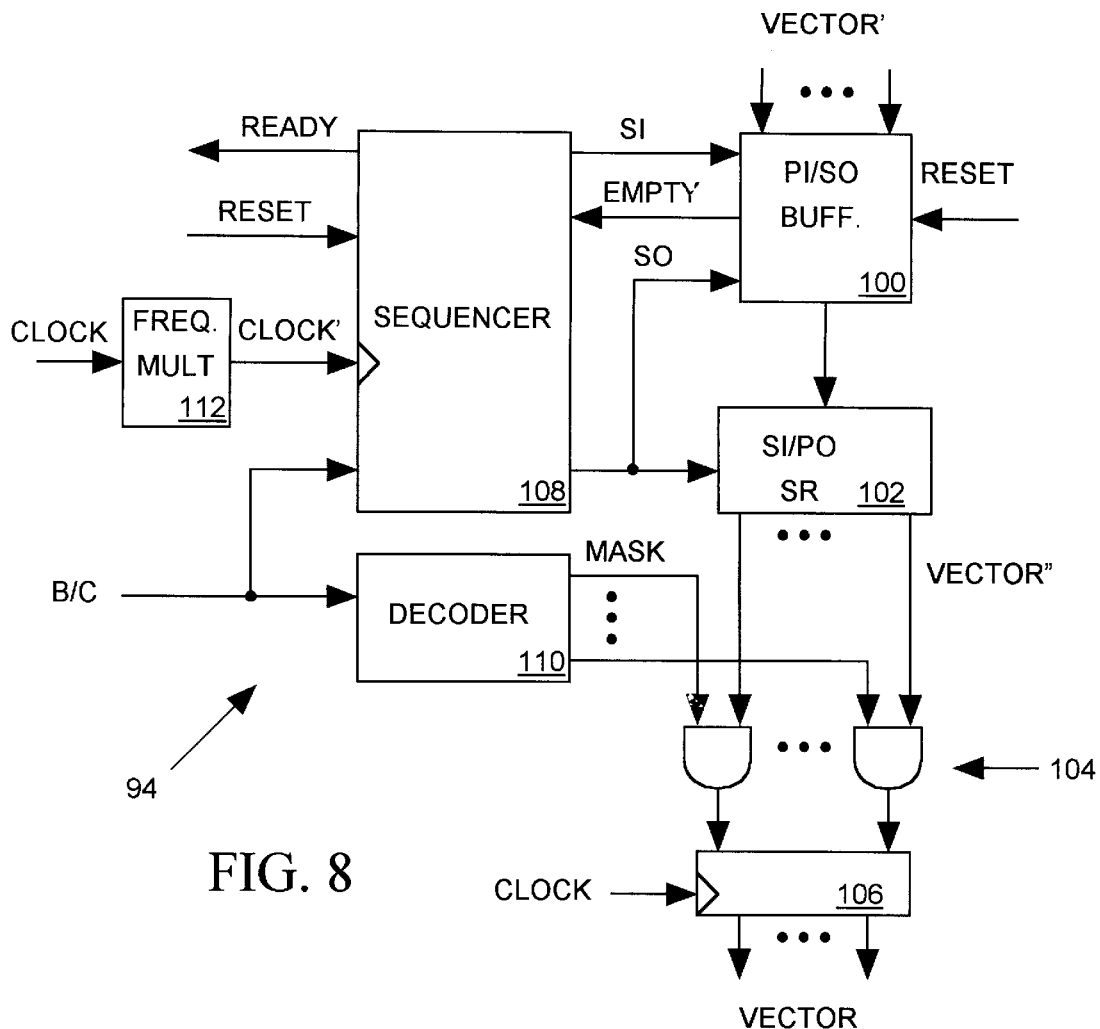
Figure 9:
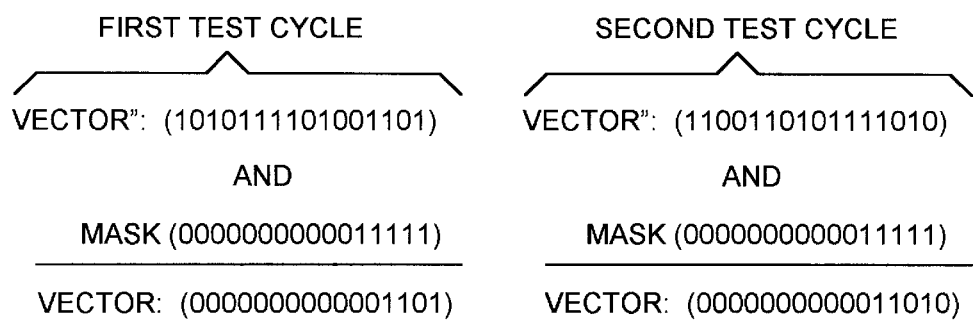

FIG. 1 illustrates in block diagram form a prior art integrated circuit (IC) tester, FIG. 2 illustrates in block diagram form an integrated circuit (IC) tester in accordance with the present invention, FIG. 3 illustrates a dual-purpose analog and digital channel of FIG. 2 in more detailed block diagram form, FIG. 4 illustrates the dual-purpose analog and digital driver of FIG. 3 in more detailed block diagram form, FIG. 5 illustrates the dual-purpose analog and digital receiver of FIG. 3 in more detailed block diagram form, FIG. 6 illustrates the timing signal generator of FIG. 3 in more detailed block diagram form, FIG. 7 illustrates the pattern generator of FIG. 3 in more detailed block diagram form, FIG. 8 illustrates the vector converter of FIG. 7 in more detailed block diagram form, and FIG. 9 illustrates the masking process of FIG. 8 in a more detailed form.

DESCRIPTION OF THE PREFERRED EMBODIMENT(S)

Tester Architecture

FIG. 2 illustrates in block diagram form an integrated circuit (IC) tester 20 in accordance with the present invention for testing an IC device under test (DUT) 22. DUT 22 may be a device such as an analog-to-digital converter communicating through both analog and digital signals. Tester 20 includes a set of N dual-purpose channels C1–CN, each for carrying out a sequence of test activities at a separate input/output (I/O) terminal of DUT 22. A load board 27 on which DUT 22 may be mounted during testing includes a set of traces 29 for connecting each channel C1–CN to a corresponding I/O terminal of DUT 22.

A test is organized into successive test cycles marked by an edge of each pulse of a CLOCK signal supplied to each channel C1–CN from a central clock source 25. During each test cycle, each channel C1–CN may supply either an analog or a digital test signal input to a DUT 22 input terminal or may digitize and process a DUT analog or digital output signal appearing at that terminal to produce test results data indicating the DUT output signal's behavior during the test cycle. Before the test, a host computer 24 writes a program into each channel C1–CN via a conventional computer bus 26. Each program tells the channel what to do during each cycle of the test. Host computer 24 then transmits a START signal concurrently to all channels C1–CN via a trigger bus 28 telling them to begin executing their test programs. When all channels C1–CN reach the end of a test they transmit an END signal to host computer 24. Host computer 24 may then signal DUT handling equipment (not shown) to remove DUT 22 from tester 20 and replace it with a next DUT to be tested.

Host computer 24 may program various channels C1–CN to monitor DUT 22 output signals during each test cycle and to send a FAIL signal outward on trigger bus 28 during any test in which a DUT 22 output signal fails to behave as expected. In such case the FAIL signal tells all channels C1–CN and host computer 22 that the DUT has failed the test, and that the test should be terminated. Host computer 24 may otherwise program each of various channels C1–CN to digitize an analog or digital DUT output signal during each test cycle to produce digital waveform data representing the behavior of the DUT output signal. Each such channel then stores the results in an internal acquisition memory. Thereafter, when host computer 24 detects the END signal on trigger bus 28, it may read access and analyze the waveform data stored in the acquisition memories of those channels to determine how DUT 22 responded to the test.

Since each dual-purpose channel C1–CN of tester 20 of FIG. 2 can handle both analog and digital DUT input or output signals, it is not necessary to provide separate single-purpose analog and digital channels as does tester 1 of FIG. 1. Since each dual-purpose channel C1–CN is about the same size as a typical single purpose digital channel, circuit boards implementing channels C1–CN of tester 20 require less total space than circuit boards implementing channels D1–DN and A1–AM of prior art tester 1. Being more compact, channels C1–CN can be positioned closer to DUT 22. Traces 29 of load board 27 that route signals between channels C1–CN and DUT 22 can therefore be more symmetric, more direct and shorter than traces 7 on load board 8 of tester 1. With shorter signal paths between the channels C1–CN and DUT 22, channels C1–CN of tester 20 can communicate with DUT 22 at higher signal frequencies and with less signal distortion than can the channels of prior art tester 1.

Channel Architecture

FIG. 3 illustrates digital/analog channel C1 of FIG. 2 in more detailed block diagram form; channels C2–CN are similar. Channel C1 includes a pattern generator 30 for producing an output vector (VECTOR) prior to each test cycle. Each VECTOR is a data value indicating an action or actions channel C1 is to carry out during the test cycle. Before each test cycle, a random access memory (lookup table 32) decodes current pattern generator output VECTOR to produce three sets of control data DC, TC and RC.

Channel C1 includes a driver circuit 34 for producing an output signal (DUT_IN) supplied as input to DUT 22 of FIG. 2. DUT_IN may be either an analog or digital signal. The DC data output of lookup table 32 supplied to driver 34 immediately before the start of each test cycle tells driver 34 how, if at all, to change the DUT_IN signal during the next test cycle. For example when DUT_IN is an analog signal, the DC data may tell driver 34 to increase or decrease its magnitude. When DUT_IN is a digital signal, the DC data may tell driver 34 to change the state of the signal during the test cycle. The DC data may also tell driver 34 to tristate the DUT_IN signal during the test cycle so that its sends no input signal to DUT 22 of FIG. 2. Channel C1 also includes a receiver circuit 38 for digitizing and processing a DUT output signal (DUT_OUT) to produce the channel's output FAIL signal or to produce RESULTS data to be stored in a acquisition memory 40. The RC data output of lookup table 32 supplied to receiver 38 at the start of each test cycle tells receiver 38 whether it is to digitize the DUT_OUT signal during the test cycle to produce a digital waveform data value representing the magnitude of the DUT_OUT signal. The RC data also tells driver 38 whether and how it is to process that digitized data to produce the channel's output FAIL signal or whether it is to store the digital waveform data as RESULTS data in acquisition memory 40.

Channel C1 also includes a timing signal generator 36 controlled by the TC output of lookup table 32 for producing a timing signal TIMING1 supplied as input to driver 34 and a timing signal TIMING2 supplied as input to receiver 38. An edge of the TIMING1 signal tells driver 34 when during a test cycle it is to carry out to the test activity indicated by its input DC data. An edge of the TIMING2 signal tells driver 34 when during a test cycle it is to digitize the DUT_OUT signal. The TC data that lookup table 32 supplies to timing signal generator 36 at the start of each test cycle indicates the timing of the edges of the TIMING1 and TIMING2 signals during the test cycle.

Thus each VECTOR output of pattern generator 30, when decoded by lookup table 32, provides DC data telling driver 34 how to change the state or magnitude of the analog or digital DUT_IN signal during a test cycle, RC data telling receiver 38 how to digitize and process the analog or digital DUT_OUT signal during a test cycle, and TC data for controlling timing of the activities of driver 34 and receiver 38 during the test cycle. Host computer 24 of FIG. 2 may write a separate program into the pattern generator 30 of each channel C1–CN via bus 26 before the start of a test. The program defines the VECTOR sequence pattern generator 30 is to produce during the test. After programming each pattern generator 30, host computer 24 sends the START signal concurrently to the pattern generators 30 of all channels C1–CN via trigger bus 28 to tell the pattern generators to begin executing their programs. Thus each pattern generator 30 begins supplying a VECTOR sequence to its local lookup table 32 in response to each pulse of the CLOCK signal from source 25 of FIG. 2. During a test in which the receiver 38 of any channel C1–CN produces a FAIL signal after detecting that the DUT_OUT signal fails to behave as expected, trigger bus 28 delivers that FAIL signal to pattern generators 30 of all channels C1–CN to tell them to stop executing their programs and to await the start of a next test. When a pattern generator 30 reaches the end of its program without detecting a FAIL signal, the last instruction of the program tells it to send the END signal to host computer 24 to indicate that the test is complete.

Vector Width Control

As discussed in detail below, driver 34 and receiver 38 can each carry out a wide variety of different types of test activities. During any test cycle driver 34 can tristate the DUT_IN signal or set the DUT_IN signal to any one of a large number of magnitudes. Driver 34 may also adjustably process the DUT_IN in various ways before sending it out to DUT 22 of FIG. 2. Timing signal generator 36 also provides a wide range of timing options for its output TIMING1 and TIMING2 signals. In order to directly select from so many different driver 34, receiver 38 and timing signal generator 36 options for each test cycle, each VECTOR output of pattern generator 30 would have to have a large number of bits. However since large VECTORs require pattern generator 30 to have a large memory, it is preferable to limit the width of its output VECTOR. While driver 34, receiver 38 and timing signal generator 36 of any given channel C1–CN may be capable of performing any of a large number of different types of test activities and event timings during any test, any particular test normally requires each channel to carry out only a relatively few of such event/timing combinations. For example during a test, a particular channel C1–CN may need only produce a digital test signal DUT_IN and may not need to digitize the DUT_OUT signal. Also state changes in that timing signal may be restricted to a relatively few times during each test cycle. In such case, since the VECTOR data produced by pattern generator 30 need only select from among a relatively few combinations of channel activities and event timings, it need only have a few bits.

Before the test, host computer 24 of FIG. 2 writes appropriate DC, TC and RC data values (TABLE_DATA) into each address of lookup table 32 corresponding to a possible value of the VECTOR output of pattern generator 30. During each test cycle, when a VECTOR output of pattern generator 30 addresses lookup table 32, the pattern generator reads out the DC, TC and RC stored at that address to driver 34, timing signal generator 36 and receiver 38. Thus while the DC, TC and RC data have the large number of bits needed to select from among a wide range of test events and timing options that channel C1 is capable of carrying out, the VECTOR output of pattern generator 30 need only have enough information to select from among the relatively few of such event and timing options that the channel will actually carry out during the test. Host computer 24 defines the information width of the VECTOR output that pattern generator 30 is to produce during the test by writing "bits-per-cycle" data (B/C) into a register within pattern generator 30 before the start of the test via bus 28. The VECTOR pattern generator 30 produces during each test cycle has a constant size of 16 bits but the information it conveys may range from 1 to 16 bits, depending on the requirements of the test. When the number of bits-per-cycle (W) is less than 16, the pattern generator 30 generates only the lower order W bits of the VECTOR and sets the higher order bits (16-W) of the VECTOR to logical 0's. Thus host computer 24 need only write TABLE_DATA into the particular lookup table 32 addresses addressed by the lower order W bits of the VECTOR. This flexibility in VECTOR size helps to minimize the size of the program host computer must provide to each pattern generator 30 and therefore helps to reduce the amount of data host computer 24 needs to program tester 20 to carry out a test. It also increases the efficiency with which program instructions are packed into available memory within channels C1–CN.

Resource Sharing

Suppose DUT 4 of prior art tester 1 of FIG. 1 has N terminals, some of which communicate through digital signals and some of which communicate though analog signals. Since DUT 4 has separate digital and analog channels D1–DN and A1–AM, various DUT channels D1–DN and A1–AM are active and others are inactive during a test depending on the relative proportion of digital and analog DUT terminals. In such case the program storage and other resources of the inactive channels are "idle" insofar as they are not used during the test.

On the other hand, since each channel C1–CN of tester 20 of FIG. 2 can function as either an analog or digital channel, all N channels C1–CN can be put to use in testing an N-terminal DUT, and no channel resources need be wasted during the test. Referring again to FIG. 3, lookup table 32 decodes the VECTOR output of pattern generator 30 to produce the DC, TC and RC control data for selecting the test activities to be carried out by driver 34 and receiver 38 and for controlling the timing of those activities during each test cycle. Since driver 34 and receiver 38 of FIG. 3 are capable of generating or digitizing either analog or digital signals, the VECTOR output of pattern generator 30 can be used to select either analog or digital test activities. Thus the pattern generation resources of each channel are efficiently allocated for the type of test activities to be performed.

Note that in a test where a DUT input or output signal switches between digital and analog during a test, the particular tester channel C1–CN of tester 20 accessing DUT signal may switch between digital and analog test activities from cycle-to-cycle. It is only necessary for lookup table 32 to decode some values of VECTOR output of the channel's pattern generator 30 so as to initiate digital activities and to decode other values of the VECTOR output to initiate analog test activities. Thus only one program is needed to control activities for that terminal. In prior art tester 1 of FIG. 1, two programs would be needed for a DUT terminal that switches from analog to digital operations. One program would be required for the digital channel accessing that terminal and one program would be required for the analog channel accessing that channel. Under such conditions, a dual-purpose channel of tester 10 therefore requires much less programming data than the combination of a digital and an analog channel of test 1 and requires only one tester channel instead of two wired to the same DUT pin as in prior art testers.

Driver Architecture

FIG. 4 illustrates the dual-purpose driver 34 of FIG. 3 in more detailed block diagram form. Driver 34 includes a register 50, clocked by the TIMING1 signal, for storing the driver control data DC output of lookup table 32 of FIG. 3. Lookup table 32 supplies the DC data to register 50 immediately before the start of a test cycle and register 50 later stores that DC data in response to an edge of the TIMING1 signal at some time during the test cycle controlled by the TC data input to timing signal generator 36 of FIG. 3.

During the test cycle, driver 34 responds to the DC data as soon as it is loaded into register 50. The DC data includes four fields (LEVEL, FC1, SW1 and TRI) for controlling various aspects of the test activity to be carried out by driver 34. The LEVEL field (suitably 8-bits) of the DC data stored in register 50 drives a digital-to-analog converter (DAC) 52 producing an output signal DAC_OUT of voltage proportional to the value of the LEVEL field. The DAC_OUT signal is supplied selectively either through a filter 56 or a switch 58 to a tristate buffer 54 which amplifies its input with sufficient power to produce the analog or digital DUT_IN signal.

When DUT_IN is to be an analog signal, the single bit SW1 field of the DC data opens switch 58 so that DAC_OUT passes through filter 56 to tristate buffer 54. When the LEVEL field has for example 8-bits, DAC 52 may set the magnitude of DAC_OUT with 8-bit resolution. The magnitude of DAC_OUT may change abruptly when the LEVEL field is loaded into register 50, but filter 56 smooths the resulting edges in the DAC_OUT signal so that DUT_IN appears as a smoothly varying analog signal. The multiple-bit FC1 field of the DC data stored in register 50 controls the frequency response characteristics of filter 56 in a well-known manner.

When DUT_IN is to be a digital signal, the LEVEL field of the DC data written into register 50 during any test cycle may have any of two values corresponding to the desired high and low logic levels of the DUT_IN signal. Also when DUT_IN is a digital signal, the SW1 field of the DC data in register 50 normally closes switch 58 so that the DAC_OUT signal bypasses filter 56, thereby allowing DUT_IN to retain its abrupt edges as is appropriate for a digital signal.

Thus driver 34 can produce either an analog or digital output signal DUT_IN during a test cycle depending on the value of the DC data written into register 50. Note that except for the use of filter 56 for analog signals, driver 34 uses the same set of components (register 50, DAC 52 and tristate buffer 54) for producing output signal DUT_IN regardless of whether DUT_IN is to be an analog or digital signal. Its dual-purpose, resource-sharing architecture allows us to implement driver 34 in more compact form than we could implement completely separate analog and digital channels.

In some applications, we may want to test a digital IC using several different logic levels. For example, when an IC is supposed to be able to be compatible with differing logiclevel conventions, for example ECL and TTL, then we might want to perform one test using ECL logic levels and then repeat the test using TTL logic levels. Prior art testers require the host computer to send control data to the digital channels before each test to set the logic levels they employ. Such host intervention takes a lot of time. However, since driver 34 can produce any of a wide number of logic levels based on its control data value supplied during a test, it can test a DUT at several different logic levels without requiring host intervention to alter the logic levels.

Receiver Architecture

FIG. 5 is a block diagram illustrating the dual-purpose analog and digital receiver circuit 38 of FIG. 3 in more detail. The RC control data output of lookup table 32 provided as input to receiver 38 before the start of a test cycle, tells receiver 38 how to process the DUT_OUT signal during the test cycle. The TIMING2 signal output of timing signal generator 36 of FIG. 3 tells receiver 38 when to process the DUT_OUT signal during the test cycle. The system CLOCK signal loads the RC data into a register 60 at the start of each test cycle and the data in register 60 controls activities of receiver 38 during the test cycle.

Receiver 38 includes an active load 74 circuit for terminating the transmission line conveying DUT_OUT from DUT 22 with its characteristic impedance so as to reduce signal reflections and also to provide a desired current loading. Receiver 38 also includes an adjustable filter 76 controlled by an FC2 field of the RC data stored in register 60 that may be used to filter the DUT_OUT signal, for example to remove noise. A switch 77 controlled by an SW2 bit of the RC data in register 60 may bypass filter 76 when it is not needed. The DUT_OUT signal, whether passing though filter 76 or switch 77 drives an input of a digitizer 64. During each test cycle, digitizer 64 responds to the TIMING2 output of timing signal generator 36 by digitizing the DUT_OUT signal to produce output data MAG indicating the current magnitude of the DUT_OUT signal. A RANGE field of the RC data stored in register 60 controls the voltage range of digitizer 64.

A random access memory (lookup table 66) processes the MAG data output of digitizer 64 to produce the FAIL and RESULTS outputs of receiver 38, along with an ACQ bit that tells acquisition memory 40 of FIG. 3 whether it is to store the FAIL and RESULTS bits. During each test cycle the MAG data output of digitizer 64 forms the lower order bits of an input address of lookup table 66 while a MS (mode select) field of the RC data stored in register 60 forms the higher order bits of the input address of lookup table 66.

Before the start of a test, host computer 24 of FIG. 2 writes data into each address of lookup table 66 so that thereafter, during each cycle of the test, lookup table 66 reads out an appropriate set of output data ACQ, FAIL and RESULTS data for each combination of values of MAG and MS.

The MS data field of the RC data, which can change from cycle-to-cycle, selects how lookup table 66 processes each particular value the MAG data may take on during a test cycle. For example, when DUT_OUT is a digital signal, it can be expected to be of either a high or low logic level during a particular test cycle. When it is expected to be of a high logic level, then the MAG data output of digitizer 64 should be within a certain range. Assume that when the MAG data output is not within that range, we want lookup table 66 to assert its output FAIL signal. The MS data for that test cycle is therefore encoded to select a particular region of the address space within lookup table 66 for which each value of MAG that is outside its allowed high level range will cause table 66 to assert the FAIL signal, while a value of MAG that is within the allowed high level range will not cause table 66 to assert the FAIL signal. During a test cycle in which DUT_OUT is expected to be within a particular low logic level range, the MS data output of register 60 selects another portion of the address space within lookup table 66 wherein its FAIL signal output is asserted only when the value of MAG indicates DUT_OUT is outside the low level range. Thus in this case the MS data field indicates the expected value or values of the MAG data.

When DUT_OUT is an analog signal and RESULTS data representing the magnitude of DUT_OUT is to be written into acquisition memory 40 of FIG. 3 during each test cycle, the MS data selects an area of lookup table 66 in which each storage location stores the RESULTS data corresponding to a separate value of MAG, and stores an ACQ bit set to a "1".

Note that depending on the nature of the data loaded into each address of lookup table 66 and on the range of value of the RC data supplied during a test, receiver 38 may alternate from cycle-to-cycle between any of several modes data processing operation and may variously treat the DUT_OUT signal as either an analog or digital signal. Thus in general, we can view the MAG data input to lookup table 66 as indicating the magnitude of DUT_OUT, the MS data input to lookup table 66 as selecting a particular mode for converting the MAG data to lookup table output data (ACQ, FAIL and RESULTS), and the data host computer 24 (FIG. 1) writes into lookup table 66 before the test as indicating how lookup table 26 is to respond to each value of MAG for each processing mode selected by the PC data. Receiver 38 is therefore highly flexible in how it responds to the DUT_OUT signal during any given test cycle.

Note that except for the use of filter 76 for time verifying analog signals, receiver 38 uses the same set of components (register 60, active load 74, digitizer 64 and lookup table 66) when processing either analog or digital DUT_OUT signals. This dual-purpose, resource-sharing architecture allows us to implement receiver 38 in more compact form than we could implement completely separate analog and digital receivers.

Digitizer Architecture

Digitizer 64 of FIG. 5 includes a buffer 62 for isolating the DUT 22 from measured circuit loading and for delivering DUT_OUT as input to a conventional flash comparator 68. Flash comparator 68 converts the output of buffer 62 to a thermometer code data D1 indicating the magnitude of the buffer 62 output signal relative to a reference signal REF generated by a DAC 72. The REF signal sets the constant of proportionality between the DUT_OUT level and the MAG output level. The RANGE field of the RC data stored in register 60 drives DAC 72. An encoder 69 converts the thermometer code D1 data into binary encoded data D2 supplied as input to a register 70 clocked by the TIMING2 signal output of timing signal generator 36 of FIG. 3. At a time during each test cycle determined by an edge of the TIMING2 signal, register 70 stores the current output of encoder 69. The current contents of register 70 form the MAG input to lookup table 66.

Timing Signal Generator Architecture

FIG. 6 is a block diagram illustrating timing signal generator 36 of FIG. 3. Timing signal generator 36 produces timing pulses telling both driver 34 (TIMING1) and receiver 38 (TIMING2) of FIG. 3 when to carry out test activities indicated by their input DC and RC control data. The CLOCK signal loads the TC output of lookup table 32 of FIG. 3 into a register 80 at the start of each test cycle.

During each test cycle a ring oscillator 82 generates a set of J timing signals T1–TJ that are frequency locked to the CLOCK signal but distributed in phase so that their pulse edges evenly divide the test cycle into J time slots. Signals T1–TJ drive a similar pair of edge generators 84–85 producing the TIMING1 and TIMING2 signals supplied to driver 34 of FIG. 3 and receiver 38 of FIG. 3. Edge generator 84, which can generate up to one positive edge and one negative edge in the TIMING1 signal, during each test cycle, includes a multiplexer 86 and an RS flip-flop 88. Multiplexer 86 under control of a portion of the TC data in register 80 selects one of the ring oscillator outputs T1–TJ to drive a set (S) input of RS flip-flop 88 and another one of the ring oscillator output signals T1–TJ to drive a reset (R) input of RS flip-flop 88. RS flip-flop 88 produces the TIMING1 signals on its Q output. A pulse at its S input causes RS flip-flop 88 to produce a positive edge in the TIMING1 signal at its Q output while a pulse on its R input causes RS flip-flop 88 to generate a negative edge in its TIMING1 signal at its Q output. Edge generator 84 and edge generator 85 allow timing signal generator 36 to vary the phase of the TIMING1 and TIMING2 signal edges relative to the CLOCK signal. Thus each timing signal can control test event timing with a resolution of 1/Jth of the period of the CLOCK signal.

Pattern Generator

FIG. 7 illustrates pattern generator 30 of FIG. 3 in more detailed block diagram form. Pattern generator 30 includes a random access program memory 90 for storing programming data from host computer 24. For each program step, program memory 90 stores data of the form (INST, VECTOR) at a separate address of program memory 90. During each test cycle an instruction processor 92 addresses program memory 90 so that it reads out a stored (INST, VECTOR) pair. The VECTOR output of program memory 90 passes through a vector converter 94 and later addresses lookup table 32 of FIG. 3, causing it to provide its output DC, RC, and TC data for the next test cycle. The instruction INST read out of program memory 90 tells instruction processor 92 how to generate the next address location ADDR for program memory 90. The instruction set is listed below in table I.

TABLE I

| INST | FUNCTION |
| --- | --- |
| INC | Increment Address |
| LoopStart N | Start of loop to be repeated N times |
| LoopEnd | End of loop |

TABLE I-continued

| INST | FUNCTION |
|---|---|
| Repeat N | Repeat vector N times |
| Call N | Jump to sub-routine at address N |
| Return | Return from call |
| End | End of test |

The INC instruction tells instruction processor 92 to generate an output memory address ADDR that is one greater than the current memory address. The LoopStart N instruction increments the current address and marks the first memory address of a loop that repeats N iterations. The LoopEnd instruction marks the last memory address of a loop. For the first N times instruction processor 92 encounters the LoopEnd instruction, it resets the memory address ADDR to the stored LoopStart address. The next time instruction possessor encounters the LoopEnd instruction, it increments the current address.

The Repeat N instruction tells instruction processor 92 to keep the output memory address ADDR unchanged for N test cycles. The Call N instruction tells instruction processor 92 to save the current address +1 as a "return" address and to then set the memory address ADDR to the value of N. The Return instruction tells instruction processor 92 to set the memory address back to the stored return address. The End instruction denotes the end of a test and tells instruction processor 92 to send an END signal to host computer 24 via trigger bus 28.

Vector Converter

FIG. 8 illustrates vector converter 94 of FIG. 8 in more detailed block diagram form. Vector converter 94 receives a sequence of 16-bit vectors (VECTOR') read out of program memory 90 of FIG. 7 and provides as output the sequence of 16-bit vectors (VECTOR) supplied to lookup table 32 of FIG. 3. As discussed above, each VECTOR output references the action(s) the tester channel CH1 is to carry out during a test cycle and indicates the time(s) during the test cycle that the action or actions are to be carried out.

While a 16-bit VECTOR word can reference up to 216 different combinations of test activities and timings, a channel will typically carry out a fewer number of different combinations of test activities and timings during a test. Thus in most test applications only a relatively few of the 16 bits of the VECTOR word are needed to select from among the limited range of activities the channel is to carry out during any given test cycle. For example, when a channel need only carry out four different combinations of test activities and timings during a test, only the two least significant bits of each VECTOR word are needed to make the selection. In such case vector converter 94 includes two bits of its input VECTOR' sequence as the two lower order bits for each word of its output VECTOR sequence and sets the other 14 higher order bits of each output VECTOR to logical 0's. For example when VECTOR words need only 2 low order bits to carry the selection information needed for each test cycle, each 16-bit VECTOR' word produced by program memory 90 of FIG. 7 controls the values of a sequence of 8 VECTOR words. Or as another example, when each VECTOR word needs 5 bits to select from among 25 combinations of test activities and timings, each set of five successive 16-bit VECTOR' words controls the value of each of a set of 16 successive 5-bit VECTOR words. Vector converter 94 could be omitted from the system and the output VECTOR' words of program memory 90 could be used to directly address lookup table 32 of FIG. 3. However vector converter 94 improves the efficiency with which the VECTOR' output of program memory 90 defines test activities, because it allows one 16-bit VECTOR' word to define test activities for one to 16 test cycles.

Referring to FIG. 8, vector converter 94 includes a buffer 100 for receiving and storing a 16-bit VECTOR' word in response to each pulse of a shift in (SI) signal produced by a sequencer 98. After storing a 16-bit VECTOR' word, buffer 100 successively shifts bits of that word out to a 16-bit serial in/parallel out shift register 102 in response to successive pulses of a shift out signal (SO) produced by sequencer 108. An array of 16 AND gates 104 ands a 16-bit MASK word output of a decoder 110 with the 16-bit word (VECTOR") stored in shift register 102 to produce a 16-bit output VECTOR value clocked through a register 106 onto the input of lookup table 32 of FIG. 3.

FIG. 9 illustrates the MASK produced by decoder 110 and the manner in which AND gates 104 combine the MASK and VECTOR" values to produce VECTORs for two successive test cycles. Decoder 110 decodes the B/C data stored in register 96 of FIG. 3 to produce its MASK word output. The MASK word determines the number of higher order bits of the 16-bit VECTOR word output AND gates 104 to be set to logical 0's and the number of lower order bits to be set to match corresponding bits of the VECTOR" word. In the example illustrated in FIG. 9, the B/C input to decoder 110 has value W=5 indicating that the lower order 5 bits of the VECTOR word are to convey test activity selection information and that the upper 16−5=11 bits of the VECTOR word are to be set to 0's. Decoder 110 therefor produces a "thermometer code" mask of value (0000000000011111). Prior to a first test cycle the 16-bit VECTOR" output of shift register 102 is, for example (1010111101001101), the MASK and VECTOR" values combine in AND gates 104 to produce a VECTOR value (0000000000001101) for the test cycle. Before a second test cycle, sequencer 108 shifts the lower 5 bits of the VECTOR" value out of shift register 102 and the VECTOR" output of shift register 102 becomes, for example, (1100110101111010. AND gates 104 then mask the upper 11 bits of VECTOR" with 0's to produce an output VECTOR value (0000000000011010) for the second test cycle.

A frequency multiplier 112 frequency multiplies the CLOCK signal by a factor of 16 to produce a CLOCK' signal for clocking sequencer 108 at a rate 16 times the test cycle frequency. The B/C data of value W is supplied as input to sequencer 108. Sequencer 108 pulses the SO signal W times during each test cycle in order to shift W bits of VECTOR' data through buffer 100 and 102 during for test cycle. When sequencer 108 has shifted all 16 bits of a VECTOR' value out of buffer 100, buffer 100 sends an EMPTY signal to sequencer 108. Sequencer 108 responds by pulsing the SI input to buffer 100 telling it to load a next VECTOR' value and by thereafter sending a NEXT signal to instruction processor 92 of FIG. 3 telling it to provide a next VECTOR' input to buffer 100.

A leading edge of the RESET signal output of instruction processor 92 produces at the end of a test clears any remaining VECTOR' data from buffer 100 and disables sequencer 108. A trailing edge of the RESET signal, produced by instruction processor 92 immediately before the first cycle of a test, initializes and enables sequencer 108.

Tester Operation

Operation of dual-purpose tester 20 can be best illustrated by an example in which DUT 22 of FIG. 2 is a digital-to-analog converter (DAC) for converting an 8-bit digital waveform into an analog output signal. Suppose we want to test DUT 22 to determine whether it will accurately generate a one megahertz sine wave. A simple way to test this is to supply it with an input data sequence that should cause the DAC to produce an output analog signal with a frequency of one megahertz. The DAC output signal is then digitized during each test cycle to produce a waveform data sequence representing the behavior of the DUT output signal. Host computer 24 can then analyze the data to determine whether the DAC has behaved as expected.

To perform such a test on a DAC, host computer 24 of FIG. 2 programs a set of eight channels C1–C8 to supply an 8-bit digital input waveform data sequence to DUT 22 that is expected to produce a 1 MHZ signal, and programs one channel C9 to provide a digital clock signal input to DUT 22 for clocking the digital input data in to DUT 22. Host computer 24 also programs channel C10 to digitize the DUT's analog output signal at an appropriate frequency.

To begin the test, host computer 24 sends a START signal to channels C1–C10 via trigger bus 28. Channels C1–C8 then begin supplying a sequence of 8-bit data values to DUT 22. Channel C9 supplies a clock pulse signaling DAC 22 to convert each 8-bit data value to a corresponding analog output signal magnitude. Channel C10 repeatedly samples the analog DUT output signal at an appropriate rate and stores the digitized values in its internal acquisition memory 40. After the test program has been executed, all of the channels send an END signal via trigger bus 28 to tell host computer 24 that the test is complete. Host computer 24 then reads digital waveform data stored by channel C10 via bus 26 and processes it to determine whether the DAC passed the test.

Since each channel C1–CN can perform either analog or digital test activities, it is not necessary to provide separate analog and digital channels to carry out such a test. This allows us to reduce the number of channels needed for a multipurpose tester. Since the dual-purpose channels are not much larger than typical single purpose channels, dual-purpose channels can therefore be positioned more closely to the DUT than a set of single purpose analog and digital channels. This allows tests to be carried out at higher frequencies with less distortion. The dual-purpose channel architecture of the present invention is particularly flexible in the way it can efficiently and flexibly allocate its pattern generation resources depending on whether the channel is to act as an analog or digital channel and on whether it is to act as a driver or receiver. The efficient use of data resources makes it possible to program the tester more quickly using less data then prior art testers of similar capability.

While the forgoing specification has described preferred embodiments of the present invention, one skilled in the art may make many modifications to the preferred embodiment without departing from the invention in its broader aspects. The appended claims therefore are intended to cover all such modifications as fall within the true scope and spirit of the invention.

What is claimed is:

1. An apparatus for performing tests on integrated circuits, each integrated circuit having a plurality of terminals, wherein each of said tests is organized into successive test cycles, the apparatus comprising a plurality of tester channels, wherein each tester channel comprises:
    data generation means for generating a sequence of control data values during each of said tests, each control data value defining a test activity to be carried out at an IC terminal during a corresponding test cycle; and
    testing means for carrying out the test activity defined by each generated control data value during its corresponding test cycle,
    wherein test activities defined by said control data values include communicating with said IC terminal via a digital signal and communicating with said IC terminal via an analog signal,
    wherein said test activities defined by said control data values include generating and sending a test signal to an IC terminal, wherein said test signal is a digital signal during test cycles of some of said tests and an analog test signal during test cycles of others of said tests, and
    wherein said testing means comprises:
        digital-to-analog conversion (DAC) means for producing a first output signal of magnitude controlled by each control data value produced by said data generation means, and
        means for adjustably processing said first output in response to each control data value to produce said test signal.

2. The apparatus in accordance with claim 1 wherein said means for adjustably processing said first output signal adjustably filters said first output signal in response to each control data value.

3. The apparatus in accordance with claim 2 wherein said means for adjustably processing said first output signal further comprises a tristate buffer controlled by each control data value for buffering said first output signal to produce said test signal.

4. The apparatus in accordance with claim 3 wherein said means for adjustably processing said first output signal comprises:
    a filter linking said DAC means to said tristate buffer for adjustably filtering said first output signal in response to each control data value, and
    a switch for selectively linking said DAC means to said buffer in response to each control data value.

5. The apparatus in accordance with claim 1 where said testing means further comprises means for generating a timing signal at a time controlled by each control data value, wherein said DAC means responds to said timing signal by producing said first output signal of magnitude controlled by said control data value.

6. The apparatus in accordance with claim 1 wherein said test activities defined by said control data values include processing an IC output signal produced at an IC terminal to produce test results data, wherein said IC output signal is a digital output signal during test cycles of some of said tests and an analog output signal during test cycles of others of said tests, and wherein each of said control data values controls a manner in which said IC output signal is to be processed.

7. The apparatus in accordance with claim 6 wherein said testing means comprises:
    means for digitizing said IC output signal during each test in response to each of said control data values to produce output data indicating a magnitude of the IC output signal, and
    means for adjustably processing said output data in a manner determined by each of said control data values to produce said test results data.

8. The apparatus in accordance with claim 7 wherein said means for adjustably processing said output data comprises lookup table means for responding to a combination of said output data and a portion of each of said control data values by producing corresponding results data.

9. The apparatus in accordance with claim 7 wherein said means for digitizing said IC output signal comprises:

means responsive to a portion of each of said control data values for generating a reference voltage, and means for receiving said IC output signal and said reference voltage, and for generating said output data having a value proportional to the magnitude of said IC output signal with a constant of proportionality controlled by said reference voltage.

10. The apparatus in accordance with claim 9 wherein said means for digitizing said IC output signal comprises:

flash comparator means for receiving said IC output signal and said reference voltage, and for generating digital flash comparator output data having a value proportional to the magnitude of said IC output signal with a constant of proportionality controlled by said reference voltage; and encoding means for receiving and encoding said digital flash comparator output data to produce said output data.

11. The apparatus in accordance with claim 7 wherein said means for digitizing said IC output signal comprises:

means for adjustably filtering said IC output signal in response to each control data value to produce a filtered IC output signal, means for digitizing said filtered IC output signal in response to each of said control data values to produce said output data indicating a magnitude of said filtered IC output signal.

12. The apparatus in accordance with claim 7 wherein each tester channel said apparatus further comprises a transmission line connecting a IC terminal to said testing means of said channel, and wherein said testing means further comprises active load means for terminating said transmission line, wherein said active load places a load on said IC terminal controlled by each said control data values.

13. The apparatus in accordance with claim 7 where said testing means further comprises means for generating a timing signal at a time controlled by each control data values, wherein said DAC means responds to said timing signal by producing said output data indicating a magnitude of the IC output signal controlled by said control data value.

14. An apparatus for performing tests on integrated circuits, each integrated circuit having a plurality of terminals, wherein each of said tests is organized into successive test cycles, the apparatus comprising a plurality of tester channels, wherein each tester channel comprises:

data generation means for generating a sequence of control data values during each of said tests, each control data value defining a test activity to be carried out at an IC terminal during a corresponding test cycle; and testing means for carrying out the test activity defined by each generated control data value during its corresponding test cycle, wherein test activities defined by said control data values include communicating with said IC terminal via a digital signal and communicating with said IC terminal via an analog signal, and wherein said data generation means comprises:

pattern generation means for generating a first vector sequence including a separate vector for each test cycle, and lookup table means for receiving each vector of said first vector sequence and for generating one of said control data values in response thereto.

15. The apparatus in accordance with claim 14 wherein said lookup table means comprises a random access memory addressed by each vector of said first vector sequence for storing control data values at addressable storage locations therein and for reading out each said control data value when addressed.

16. The apparatus in accordance with claim 15 further comprising means for writing control data values into said addressable storage locations of said random access memory.

17. The apparatus in accordance with claim 15 wherein said pattern generation means comprises:

means for generating a second vector sequence; and means for receiving and converting said second vector sequence into said first vector sequence, wherein each vector of said first vector sequence comprises a number of bits of vectors of said second sequence, wherein said number of bits is adjustably controlled by input data.

18. An apparatus for performing tests on integrated circuits, each integrated circuit having a plurality of terminals, wherein each of said tests is organized into successive test cycles, the apparatus comprising a plurality of tester channels, wherein each tester channel comprises:

data generation means for generating a sequence of control data values during each of said tests, each control data value defining a test activity to be carried out at an IC terminal during a corresponding test cycle; and testing means for carrying out the test activity defined by each generated control data value during its corresponding test cycle, wherein test activities defined by said control data values include communicating with said IC terminal via a digital signal and communicating with said IC terminal via an analog signal, wherein said test activities defined by said control data values include generating and sending a test signal to an IC terminal, wherein said test signal is a digital signal during test cycles of some of said tests and an analog test signal during test cycles of others of said tests, wherein said test activities defined by said control data values also include processing an IC output signal produced at an IC terminal to produce test results data, and wherein said IC output signal is a digital output signal during test cycles of some of said tests and an analog output signal during test cycles of others of said tests.

19. The apparatus in accordance with claim 18 wherein each of said control data values selects whether said test signal is generated as said analog test signal and whether said test signal is generated as said digital test signal, and wherein each of said control data values controls a manner in which said IC output signal is to be processed.

20. The apparatus in accordance with claim 19 further comprising:

pattern generation means for generating a first vector sequence including a separate vector for each test cycle, and lookup table means for receiving each vector of said first vector sequence and for generating one of said control data values in response thereto, wherein lookup table means comprises a random access memory addressed by each vector of said vector sequence for storing control data values at addressable storage locations therein and for reading out each said control data value when addressed.

21. The apparatus in accordance with claim 18 wherein said testing means comprises:

digital-to-analog conversion (DAC) means for producing a first output signal of magnitude controlled by each control data value produced by said data generation means, means for adjustably filtering said first output signal in response to said control data values to produce said test signal, means for adjustably filtering and digitizing said IC output signal in response to control data values to produce digital output data indicating a magnitude of the IC output signal, and means for adjustably processing said digital output data in a manner determined by each of said control data values to produce said test results data.

\* \* \* \* \*